United States Patent
Igarashi et al.

[11] Patent Number: 6,120,884
[45] Date of Patent: Sep. 19, 2000

[54] CONDUCTOR PASTE AND MULTILAYER CERAMIC PART USING THE SAME

[75] Inventors: Katsuhiko Igarashi; Hidenori Ohata; Takahide Kurahashi; Kazuaki Suzuki, all of Chiba, Japan

[73] Assignee: TDK Corporation, Tokyo, Japan

[21] Appl. No.: 09/043,571

[22] PCT Filed: Jun. 23, 1997

[86] PCT No.: PCT/JP97/02144

§ 371 Date: May 12, 1998

§ 102(e) Date: May 12, 1998

[87] PCT Pub. No.: WO98/05045

PCT Pub. Date: Feb. 5, 1998

[51] Int. Cl.[7] .................................................. B32B 17/00
[52] U.S. Cl. .................... 428/209; 428/210; 428/469; 428/701; 428/702; 252/514; 333/1.1
[58] Field of Search ..................... 428/209, 210, 428/469, 472, 701, 702; 333/1.1; 252/514

[56] References Cited

U.S. PATENT DOCUMENTS 5,450,045 9/1995 Miura ........................................ 333/1.1
5,662,754 9/1997 Marusawa ................................ 156/89

Primary Examiner—Timothy M. Speer
Attorney, Agent, or Firm—Oblon,Spivak,McClelland, Maier & Neustadt, P.C.

[57] ABSTRACT

An object is to provide a conductor paste of quality which uses a silver base internal conductor, suppresses the generation of voids and the concomitant occurrence of cracks even when co-fired with ceramic material by the conductor melting method, and has improved productivity, reduced cost, and improved electrical properties. The conductor paste is prepared by dispersing a silver base conductive material and a metal oxide in a vehicle. At least one of Ga oxide, La oxide, Pr oxide, Sm oxide, Eu oxide, Gd oxide, Dy oxide, Er oxide, Tm oxide, and Yb oxide is used as the metal oxide. The conductor paste is fired at a temperature between the melting point and lower than the boiling point of the conductive material.

14 Claims, 2 Drawing Sheets

CONDUCTOR PASTE AND MULTILAYER CERAMIC PART USING THE SAME

FIELD OF THE INVENTION

This invention relates to a multilayer ceramic part and a conductor paste for use in forming an internal conductor therein, and more particularly, to an integrated non-reciprocal circuit element mounted in radio communication equipment adapted to operate in the microwave band or millimeter wave band and a conductor paste for use in forming an internal conductor therein.

BACKGROUND ART

In conjunction with the drastic advance of radio communication technology in the recent years, there is an increasing demand for electronic parts adapted to operate in a frequency band of several hundred megahertz to several gigahertz or higher. Also, in conjunction with the size reduction of radio communication devices as typified by cellular phones, high-frequency electronic parts mounted in such devices are also required to be reduced in size and price. Various integration techniques have been applied to manufacture multilayer ceramic parts.

In multilayer ceramic parts, a ceramic material and a conductor material have been co-fired so that one or more functions are incorporated in one part. Such multilayer ceramic parts are manufactured by stacking a ceramic material and a conductor material by a printing or sheeting technique to form a laminate, dicing the laminate to a desired shape and dimensions and then firing the shaped laminate or firing the laminate and then dicing the fired laminate to a desired shape and dimensions, and thereafter forming external conductors if necessary. Consequently, the multilayer ceramic parts are of the structure having internal conductor layers each between ceramic layers. Silver, copper, etc. were generally used as the internal conductor suitable for high frequency, especially microwave. In the above-mentioned manufacturing process, it was believed that the melting of the internal conductor should be avoided in order to accomplish satisfactory properties. It was thus believed that firing should be done at a temperature not higher than the melting point of the internal conductor. For this reason, it was believed impossible to use silver, copper and similar conductive materials having a low resistivity, but a low melting point as the internal conductor in combination with ceramic materials to be fired at high temperature.

Meanwhile, JP-A 252618/1994 of the present applicant discloses a method for forming a low-melting internal conductor as mentioned above in a ceramic material which is not adapted for low-temperature firing. This method, which is designated conductor melting method, is by firing a multilayer ceramic part at a temperature between the melting point and less than the boiling point of a conductive material used as an internal conductor, whereupon the fired conductor material solidifies in a cooling step to form an internal conductor. This method has the tendency that the grain boundary between metal gretins which is formed as the molten conductor material solidifies becomes thin enough to be regarded extinguished in a substantial sense and the interface between the ceramic material and the internal conductor has less irregularities. The internal conductor is thus reduced in high-frequency resistance and the Q value in the high-frequency region is increased. Further, inexpensive conductive materials having a relatively low melting point such as silver and copper can be used as the internal conductor. Moreover, the method is fully advantageous in productivity and cost because the ceramic material and the internal conductor can be simultaneously fired.

DISCLOSURE OF THE INVENTION

The aforementioned conductor melting method, however, has the problem that voids can form in the internal conductor when the once melted internal conductor solidifies in the subsequent cooling step, resulting in the internal conductor having an increased resistance and the multilayer ceramic part having a decreased Q value. Though rarely, the internal conductor itself can be broken by voids. Also, once voids are formed, the gas in the voids expands under the influence of the latent heat of solidification in the cooling step, causing the fired ceramic body to crack. This results in a reduced production yield. Thus the generation of voids in the internal conductor must be inhibited before multilayer ceramic parts can be manufactured by the conductor melting method.

The present invention has been made under the above-mentioned circumstances and its object is to provide a conductor paste of quality which uses a silver base internal conductor, suppresses the generation of voids and the concomitant occurrence of cracks even when co-fired with ceramic material by the conductor melting method, and has improved productivity, reduced cost, and improved electrical properties, and a multilayer ceramic part using the same.

This and other objects are achieved by the construction which is defined below as (1) to (6).

(1) A conductor paste comprising a silver base conductive material and a metal oxide dispersed in a vehicle wherein said metal oxide is at least one member selected from the group consisting of gallium oxide, lanthanum oxide, praseodymium oxide, samarium oxide, europium oxide, gadolinium oxide, dysprosium Dxide, erbium oxide, thulium oxide, and ytterbium oxide.

(2) The conductor paste of (1) wherein the content of said metal oxide is 0.1 to 20 parts by weight per 100 parts by weight of said conductive material.

(3) The conductor paste of (1) or (2) which is applied to the conductor melting method.

(4) A multilayer ceramic part comprising an internal conductor layer and a ceramic layer, wherein said internal conductor layer has been prepared by firing the conductor paste of any one of (1) to (3) at a temperature between the melting point and lower than the boiling point of said conductive material.

(5) The multilayer ceramic part of (4) wherein said ceramic layer is formed of an iron-containing material.

(6) The multilayer ceramic part of (4) or (5) which is a non-reciprocal circuit element.

BEST MODE FOR CARRYING OUT THE INVENTION

Figure 1:
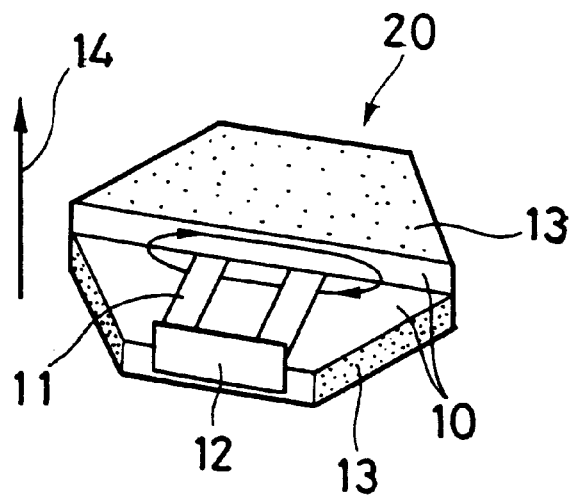
FIG. 1 is a partially cut-away perspective view schematically illustrating the construction of a magnetic circulator element of a three-port circulator.

The invention is described below in more detail.

The conductor paste of the invention is comprised of a silver base conductive material and a selected metal oxide dispersed in a vehicle.

A multilayer ceramic part is manufactured by sandwiching the conductor paste between ceramic material layers and firing the sandwich at a temperature between the melting point and lower than the boiling point of the conductive material, thereby forming an internal conductor layer and ceramic layers. In this firing step, the metal oxide in the conductor paste reacts with the ceramic material whereupon the reaction product lowers the interfacial energy of silver. As a result, the molten silver is improved in wettability so that the silver conductor uniformly spreads throughout the internal conductor layer portion within the fired ceramic body to prevent the generation of voids. Since no voids are formed, it never happens that the gas ir. voids expands to cause the fired ceramic body to crack. Further, since firing causes the majority of the metal oxide to react with the ceramic body and diffuse into the body, the metal oxide is substantially absent in the conductor. As a result, the internal conductor layer has a conductor resistance equal to or close to the conductor resistance of pure silver.

The conductive material centains silver as a main component. It may be silver alone or a mixture of silver with a metal capable of forminc a solid solution with silver, such as copper, gold, palladium, and platinum. Regardless of the species of metal added, the silver content of the conductive material should be 70 mol % or higher. This is because the resistivity of an alloy becomes higher than the resistivity of silver if the content of a mixing component exceeds 30 mol %. More desirably, the content of a mixing component is restricted to 5 mol % or less (the silver content is 95 mol % or higher) in order to inhibit the manufacturing cost from increasing.

The metal oxide is at least one member selected from the group consisting of gallium oxide ($Ga_2O_3$), lanthanum oxide ($La_2O_3$), praseodymium oxide ($Pr_6O_{11}$), samarium oxide ($Sm_2O_3$), europium oxide ($Eu_2O_3$), gadolinium oxide ($Gd_2O_3$), dysprosium oxide ($Dy_2O_3$), erbium oxide ($Er_2O_3$), thulium oxide ($Tm_2O_3$), and ytterbium oxide ($Yb_2O_3$). This is because these metal oxides can react with the ceramic body and diffuse into the body. In this regard, if the content of the metal oxide is less than 0.1 part by weight per 100 parts by weight of the conductive material, no sufficient reaction phase is created at the interface and the wettability of silver is deteriorated. If the content exceeds 20 parts by weight, all the metal oxide (annot diffuse out, and some metal oxide is left behind in the internal conductor to increase the conductor resistance. For this reason, the content of the metal oxide is preferably 0.1 to 20 parts by weight per 100 parts by weight of the conductive material. The particle size of the conductive material is not critical although a mean particle size of 0.1 to 20 $\mu$m is preferred when the conductor is formed by a screen printing technique. It is also preferred for the same reason that the metal oxide have a mean particle size of 0.1 to 20 $\mu$m.

The conductor paste of the invention is obtained by dispersing the conductive material and the metal oxide in a vehicle and kneading the mixture. An appropriate one or more of binders such as ethyl cellulose, nitrocellulose, and acrylic resins, organic solvents such as terpineol, Butyl Carbitol and Hexyl Carbitol, dispersants, activating agents, and the like are optionally added as the vehicle. The vehicle content of the conductor paste is preferably 5 to 70% by weight. The conductor paste is preferably adjusted to a viscosity of about 300 to 30,000 centipoise.

Various multilayer ceramic parts are obtained by alternately laying the conductor paste of the invention and a ceramic material by a well-known technique such as printing and sheeting techniques, to thereby form a green laminate, and firing it at a temperature between the melting point and lower than the boiling point of the conductive material. There can be fabricated, for example, chip capacitors, chip inductors, circulators, isolators, LC filters, semiconductor capacitors, and glass ceramic multilayer boards. The conductor paste of the invention can be used in combination with any ceramic material selected for one of various applications although upon firing, the metal oxide effectively reacts particularly with a ceramic material containing iron (Fe). Therefore, the conductor paste of the invention is effective particularly when combined with various ferrite materials such as garnet type ferrite and Ni—Cu—Zn ferrite, and best suited as the internal conductor of non-reciprocal circuit elements (e.g., circulators and isolators) and chip inductors.

Among various non-reciprocal circuit elements to which the invention is preferably applicable, a circulator is described as a typical example. The preferred circulator to which the invention is applicabLe is exemplified in U.S. application Ser. No. 08/219,917 (U.S. Pat. No. 5,450,045). The circulator includes a magnetic circulator element. The magnetic circulator element includes internal conductors, an insulating magnetic body which has been fired integral with the internal conductors so that the magnetic body closely surrounds the internal conductors, a plurality of terminal electrodes electrically connected to one end of the internal conductors, a plurality of capacitors coupled to the terminal electrodes for providing resonance with the applied high frequency, and exciting permanent magnets for applying a DC magnetic field across the magnetic circulator element. In the circulator of this construction, high-frequency magnetic fluxes form continuous closed loops in the magnetic circulator element due to the absence of discontinuity within the magnetic body, so that no demagnetizing field generates. This allows for size reduction, band broadening, and loss reduction and enables cost reduction.

Figure 2:
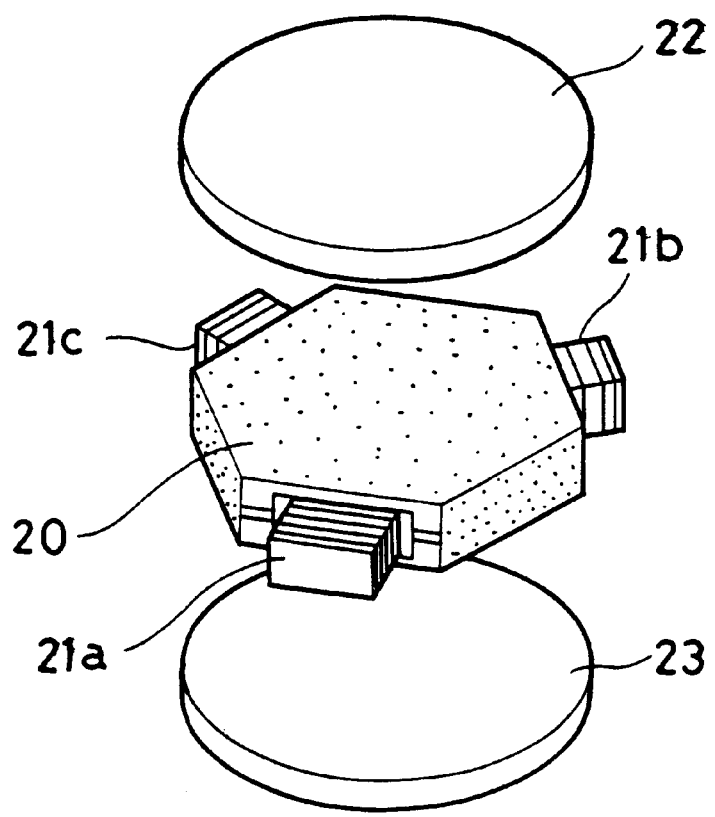
FIG. 2 is an exploded perspective view illustrating the overall construction of the three-port circulator.
Figure 3:
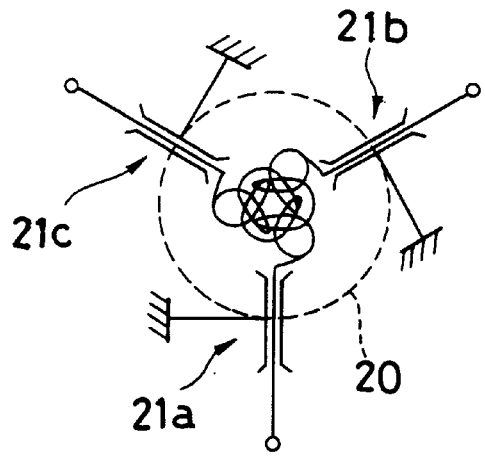
FIG. 3 is an equivalent circuit diagram of the threeport circulator of FIG. 2.

FIG. 1 is a partially cut-away perspective view schematically illustrating the construction of a magnetic circulator element of a three-port circulator which is one example of the above-mentioned circulators, FIG. 2 is an exploded perspective view illustrating the overall construction of this circulator, FIG. 3 is an equivalent circuit diagram of this circulator, and FIG. 4 illustrates steps in a process for manufacturing the magnetic circulator element of this circulator.

As shown in these figures, this circulator is a three-port circulator and its circulator element 20 is formed to a regular hexagon in plane shape. However, the plane shape of this element need not necessarily be a regular hexagon insofar as a symmetrical rotating magnetic field can be produced, and may be formed to any hexagonal shape other than the regular hexagon or another polygonal shape. The polygonal plane shape of the circulator element permits spaces available on side surfaces thereof to be effectively utilized for attaching discrete circuit elements such as resonating capacitors, enabling to maintain the overall size compact.

In FIG. 1, a reference numeral 10 denotes an integrally fired magnetic material layer. A predetermined pattern of inner conductors (center conductors) 11 is formed so that it is surrounded by the magnetic material layer 10. The inner conductors 11 in the illustrated construction are formed as two laminated layers. Each layer is formed with a coil pattern consisting of three pairs of strips extending in three radial directions (radial direction perpendicular to at least one side of the hexagon). The coil patterns of strips extending in the same direction on both the layers are electrically connected to each other by via hole conductors. In this structure, the magnetic material layer is also utilized as an insulating layer. One end of each coil pattern is electrically connected to one of terminal electrodes 12 which are formed on every other side surface of the magnetic material layer 10. A grounding conductor (ground electrode) 13 is formed on top and bottom surfaces and also on the side surfaces of the magnetic material layer where the terminal electrodes 12 are absent. Another end of the coil pattern is electrically connected to the grounding conductor 13 on one side surface.

As shown in FIG. 2, the circulator as a whole has resonating capacitors 21a, 21b and 21c electrically connected to the three terminal electrodes (12) of the magnetic circulator element 20, respectively. These capacitors 21a, 21b and 21c are preferably high-frequency feed-through capacitors having a high self-resonance frequency as described in JP-A 251262/1993 filed by the applicant. The high-frequency capacitor has a multilayer triplate strip line structure constructed by laminating at least one multilayer unit, a grounding conductor and a dielectric layer in the described order. Each multilayer unit is formed by laminating a grounding conductor, a dielectric material, an inner conductor and a dielectric material in the described order. The use of such a feed-through capacitor having a broader operating frequency range can prevent the reduction of Q value. The manner of connecting the terminal electrodes and the capacitors is as shown in the equivalent circuit of FIG. 3.

Exciting permanent magnets 22 and 23 (see FIG. 2) are disposed above and below the magnetic circulator element 20 for applying a DC magnetic field 14 (see FIG. 1) across the circulator element 20.

Next, a process for manufacturing the circulator of the above-illustrated construction is described.

Figure 4A:
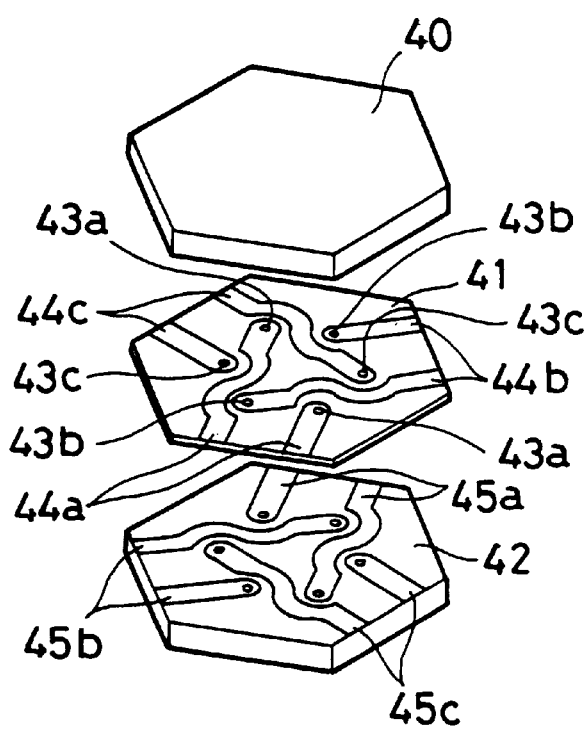
FIGS. 4A, 4B, and 4C illustrate steps in a process for manufacturing the magnetic circulator element of FIG. 1.

There are furnished upper, intermediate and lower sheets 40, 41 and 42 of the same insulating magnetic material as shown in FIG. 4A. Usually the upper and lower sheets 40 and 42 have a thickness of about 0.5 to 2 mm and they are formed by laminating a plurality of sheets of about 100 to 200 µm thick (preferably 160 µm thick). The intermediate sheet 41 has a thickness of about 30 to 200 µm, preferably about 160 µm.

The magnetic material used herein is generally a garnet type ferrite for high-frequency application. The garnet type ferrite for high-frequency application is preferably of a yttrium iron garnet (YIG) system, more illustratively substituted garnet ferrite of the basic composition $Y_3Fe_5O_{12}$ having various elements added. The composition of the substituted garnet ferrite is represented by the following formula.

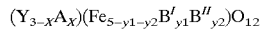

$(Y_{3-x}A_x)(Fe_{5-y1-y2}B'_{y1}B''_{y2})O_{12}$

Element A substituting for Y is preferably at least one of Ca and Gd, and a trace additive for improving properties is preferably at least one of Ho, Dy and Ce. Element B' substituting for Fe is preferably at least one of V, Al, Ge, and Ga, element B'' is at least one of Sn, Zr, and In, and a trace additive for improving properties is preferably at least one of Mn, Co and Si. The substitution ratios are preferably in the range:

$0 \leq x \leq 1.5$,
$0 \leq y1 \leq 1.5$, and
$0 \leq y2 \leq 0.5$.

The atomic ratio of the property improving trace additive in the above formula is generally up to 0.2. Also, the ratio of (Y inclusive of substitute element): (Fe inclusive of substitute element): O may deviate from the stoichiometric compositional ratio of 3:5:12.

The magnetic material sheets are formed using a magnetic material paste comprising a magnetic material and a vehicle.

The intermediate sheet 41 is provided at predetermined positions with via holes 43a, 43b and 43c extending therethrough. At each via hole position, a via hole conductor having a slightly larger diameter than the via hole is formed by printing or transferring. The via hole conductor may be either the same conductive material as the internal conductors or a material having a higher melting point.

On the upper surfaces of the intermediate and lower sheets 41 and 42, upper inner conductors 44a, 44b and 44c and lower inner conductors 45a, 45b and 45c are formed by printing or transferring an internal conductor paste. These inner conductors 44a, 44b and 44 (45a, 45b and 45c) are three sets of coil patterns. Each set of coil pattern consists of a pair of strips which extend in the same radial direction (radial direction perpendicular to at least one side of the hexagon) while stepping aside from the via holes of other strips. The thus formed upper sheet 40, intermediate sheet 41 and lower sheet 42 are stacked in order and then joined by heat pressing. This results in trigonally symmetric coil patterns being formed on the front and rear surfaces of the intermediate sheet 41. Due to the symmetry, propagation characteristics become coincident among the ports of the three-port circulator.

Figure 4B:
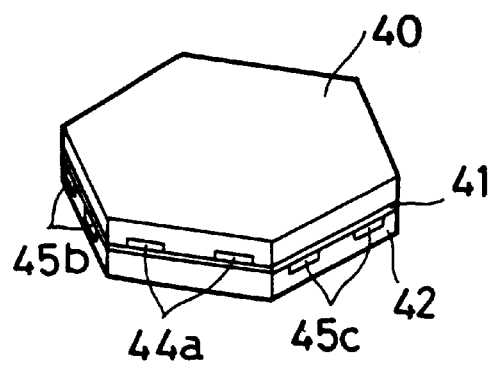

The stack of upper sheet 40, intermediate sheet 41 and lower sheet 42 as shown in FIG. 4B is then fired at a temperature between the melting point and lower than the boiling point of the conductive material. The firing may be carried out one or more times. When firing is carried out plural times, at least one firing step is carried out at the melting point or higher temperature. By this firing, the magnetic material layers of the upper sheet 40, intermediate sheet 41 and lower sheet 43 are integrated into a single continuous body.

Although the upper, intermediate and lower sheets 40, 41 and 42 are illustrated as preformed regular hexagonal sections in FIGS. 4A and 4B, the sheets are diced after the firing step so that the conductive material may not melt or flow out since firing is done at the melting point of the conductive material or higher temperature according to the invention.

As a result of the above-mentioned firing step, one ends of the upper inner conductors 44a, 44b and 44c are electrically connected to one ends of the lower inner conductors 45a, 45b and 45c through the via hole conductors in the via holes 43a, 43b and 43c, respectively.

Figure 4C:
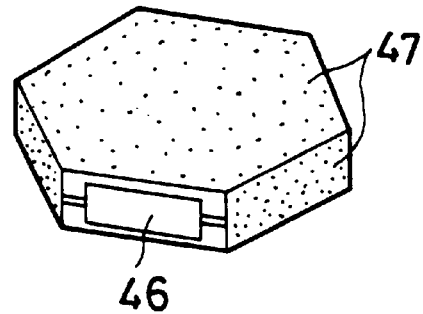

After firing and dicing, each magnetic circulator element is barrel polished whereby the internal conductors are exposed at the side surfaces and the sintered body is chamfered at the corners. Thereafter, as shown in FIG. 4C, terminal electrodes 46 are formed on every other side surface of the circulator element, and a grounding conductor 47 is formed on top and bottom surfaces and on the side surfaces of the circulator element where the terminal electrodes 46 are absent. As a result, the other ends of the upper inner conductors 44a, 44b and 44c which are exposed on the side surfaces of the circulator element are electrically connected to the terminal electrodes (46). Also the other ends of the lower inner conductors 45a, 45b and 45c which are exposed on the side surfaces of the circulator element are electrically connected to the grounding conductor (47). Thereafter the resonating capacitors 21a, 21b and 21c are mounted and soldered by solder reflow to the terminal electrodes (46) of the circulator element as shown in FIG. 2. A circulator is then completed by assembling the circulator element, exciting permanent magnets for applying a DC magnetic field, and a metal housing also serving as a magnetic yoke.

Although the above-mentioned exemplary construction relates to a three-port circulator, the present invention is applicable to circulators having more than three ports. Further, in addition to the lumped-parameter circulator, the present invention is applicable to a distributed-parameter circulator having a circulator element integrated with a capacitive circuit and having an impedance transformer combined in its terminal circuit for broadening the operating frequency band. Also, non-reciprocal circuits such as isolators can be readily fabricated as an extension of such circulators.

EXAMPLE

Examples of the invention are given below by way of illustration.

Example 1

A magnetic material was prepared by furnishing $Y_2O_3$ and $Fe_2O_3$ as main raw materials, mixing them, and calcining the mixture at 1,300° C. for 4 hours. The calcined power was pulverized, and the pulverized powder was mixed with an organic binder and an organic solvent into a slurry. From the slurry, green sheets were formed by the doctor blade technique.

Next, a conductor paste was prepared by mixing silver (mean particle size 5 μm), a metal oxide (mean particle size 0.2 μm), and a vehicle in a three-roll mill. The vehicle used herein was a mixture of a binder consisting of acrylic and ethyl cellulose resins and an organic solvent consisting of Butyl Carbitol and Hexyl Carbitol. The viscosity was adjusted to 2,000 centipoise. Table 1 shows the type of the metal oxide and the amount thereof per 100 parts by weight of the conductive material. It is noted that the vehicle was added so as to give a content of 10% by weight in the conductor paste.

The conductor paste was printed on the green sheets by the screen printing technique and dried. They were stacked so as to define a predetermined pattern and press bonded in a thickness direction to form a compact. The compact was then fired at 1,480° C. for 1 hour and diced to a desired shape, obtaining a non-reciprocal circuit element.

For each material, 50 samples were prepared to examine a percent crack occurrence. One sample was randomly picked up for each material and measured for conductor resistivity. It is noted that although the resistance developed as a sum of the resistance of the conductor and a resistance increment due to the loss of the magnetic body, the loss of the magnetic body could be neglected by applying an external magnetic field in excess of the saturation magnetization of the magnetic body which was equal to 1,200 Gauss, and then the resistance of the conductor could be determined in a substantial sense. Using a network analyzer (by Hewlett Packard), a conductor resistivity was determined under an applied magnetic field of 5,000 Gauss. The results are shown in Table 1.

TABLE 1

| No. | Metal oxide | Content (pbw) | Conductor resistivity (Ω-cm) | Crack occurrence (%) |
| --- | --- | --- | --- | --- |
| 1* | none | — | — | 100 |
| 2 | $Ga_2O_3$ | 0.05 | $1.6 \times 10^{-6}$ | 20 |
| 3 | $Ga_2O_3$ | 0.2 | $1.6 \times 10^{-6}$ | 0 |
| 4 | $Ga_2O_3$ | 0.4 | $1.6 \times 10^{-6}$ | 0 |
| 5 | $Ga_2O_3$ | 0.5 | $1.6 \times 10^{-6}$ | 0 |
| 6 | $Ga_2O_3$ | 1.6 | $1.6 \times 10^{-6}$ | 0 |
| 7 | $Ga_2O_3$ | 9.0 | $1.7 \times 10^{-6}$ | 0 |
| 8 | $Ga_2O_3$ | 15.0 | $2.0 \times 10^{-6}$ | 0 |
| 9 | $Ga_2O_3$ | 19.0 | $2.5 \times 10^{-6}$ | 0 |
| 10 | $Ga_2O_3$ | 25.0 | $5.0 \times 10^{-6}$ | 0 |
| 11 | $Sm_2O_3$ | 0.2 | $1.6 \times 10^{-6}$ | 0 |
| 12 | $Sm_2O_3$ | 0.4 | $1.6 \times 10^{-6}$ | 0 |
| 13 | $Sm_2O_3$ | 1.6 | $1.8 \times 10^{-6}$ | 0 |
| 14 | $Sm_2O_3$ | 5.0 | $2.0 \times 10^{-6}$ | 0 |
| 15 | $Sm_2O_3$ | 9.0 | $2.2 \times 10^{-6}$ | 0 |
| 16 | $Sm_2O_3$ | 15.0 | $2.9 \times 10^{-6}$ | 0 |
| 17 | $Sm_2O_3$ | 19.0 | $3.3 \times 10^{-6}$ | 0 |
| 18 | $La_2O_3$ | 0.2 | $1.6 \times 10^{-6}$ | 0 |
| 19 | $Pr_6O_{11}$ | 0.2 | $1.7 \times 10^{-6}$ | 0 |
| 20 | $Eu_2O_3$ | 0.2 | $1.9 \times 10^{-6}$ | 0 |
| 21 | $Gd_2O_3$ | 0.2 | $2.1 \times 10^{-6}$ | 0 |
| 22 | $Dy_2O_3$ | 0.2 | $2.0 \times 10^{-6}$ | 0 |
| 23 | $Er_2O_3$ | 0.2 | $2.0 \times 10^{-6}$ | 0 |
| 24 | $Tm_2O_3$ | 0.2 | $1.9 \times 10^{-6}$ | 0 |
| 25 | $Yb_2O_3$ | 0.2 | $2.0 \times 10^{-6}$ | 0 |
| 26* | $SeO_2$ | 0.2 | — | 100 |
| 27* | $Rb_2O$ | 0.2 | — | 100 |
| 28* | $Lu_2O_3$ | 0.2 | — | 100 |
| 29* | $Cs_2O$ | 0.2 | — | 100 |
| 30* | $Ta_2O_5$ | 0.2 | — | 100 |
| 31* | $HfO_2$ | 0.2 | — | 100 |
| 32* | $SiO_2$ | 0.2 | — | 100 |
| 33* | $Sc_2O_3$ | 0.2 | — | 100 |

*Comparative Example

It is noted that for Nos. 1 and 26 to 33 in Table 1 which are Comparative Examples, a conductor resistivity could not be determined because all the samples cracked. The sample (No. 2) whose metal oxide content was less than the preferred range showed an increased percent crack occurrence because many voids generated. The sample (No. 10) whose metal oxide content was more than the preferred range showed an increased conductor resistivity.

Example 2

A chip inductor was prepared by using Ni—Cu—Zn ferrite green sheets as ceramic layers, forming the conductor paste No. 5 in Table 1 to an inductor internal conductor layer pattern, stacking them, and heat press bonding to form a laminate. The laminate was fired at 1,100° C. for one hour and diced to a predetermined shape.

The crack occurrence was 0% when the number of samples was 50.

Example 3

A chip capacitor was prepared by using $BaTiO_3$ base dielectric green sheets as ceramic layers, forming the conductor paste No. 5 in Table 1 to a capacitor internal conductor layer pattern, stacking them, and heat press bonding to form a laminate. The laminate was fired at 1,380° C. for 3 hours and diced to a predetermined shape.

The crack occurrence was 0% when the number of samples was 50.

Example 4

Non-reciprocal circuit elements were fabricated as in Example 1 except that the composition of the magnetic body was changed to $Y_3(Fe_{4.9}Mn_{0.1})O_{12}$,
$Y_3(Fe_{4.55}Al_{0.35}Mn_{0.1})O_{12}$,
$Y_3(Fe_{4.23}Al_{0.67}Mn_{0.1})O_{12}$,
$(Y_{2.4}Ca_{0.6})(Fe_{4.7}V_{0.3})O_{12}$ or
$(Y_{2.4}Gd_{0.6})(Fe_{4.57}Al_{0.43})O_{12}$.

These elements were tested as in Example 1. As a result, equivalent results to Example 1 were obtained in accordance with the conductor pastes used.

The effectiveness of the invention is evident from the foregoing Examples.

INDUSTRIAL APPLICABILITY

When a multilayer ceramic part is prepared by firing a conductor paste simultaneous with a ceramic material by the conductor melting method, the conductor paste of the invention inhibits the generation of voids and the concomitant occurrence of cracks in the ceramic body. Conductor resistivity is low. Using this conductor paste, multilayer ceramic parts of extremely high quality can be prepared in high yields.

We claim:

1. A conductor paste comprising conductive silver or silver alloy and a metal oxide dispersed in a vehicle wherein said metal oxide is at least one member selected from the group consisting of gallium oxide, lanthanum oxide, praseodymium oxide, samarium oxide, europium oxide, gadolinium oxide, dysprosium oxide, erbium oxide, thulium oxide, and ytterbium oxide, and the conductor paste is adapted to the conductor melting method.

2. The conductor paste of claim 1 wherein the content of said metal oxide is 0.1 to 20 parts by weight per 100 parts by weight of the conductive silver component of said paste.

3. The conductor paste of claim 1 which is free of a glass component.

4. A multilayer ceramic part comprising an internal conductor layer and a ceramic layer, wherein said internal conductor layer has been prepared by firing the conductor paste of claim 1 at a temperature between the melting point and lower than the boiling point of said conductive material.

5. The multilayer ceramic part of claim 4 wherein said ceramic layer is formed of an iron-containing ceramic.

6. The multilayer ceramic part of claim 5 wherein the iron containing ceramic is of a yttrium iron garnet system.

7. The multilayer ceramic part of claim 4 which is a non-reciprocal circuit element.

8. The conductor paste of claim 1, wherein the metal which alloys with silver is copper, gold, palladium or platinum.

9. The conductor paste of claim 1, wherein the silver content of the conductive component of the paste is at least 70 mol %.

10. The conductor paste of claim 1, wherein the particle size of the conductive silver component ranges from 0.1 to 20 $\mu$m.

11. The conductor paste of claim 1, wherein the particle size of said metal oxide ranges from 0.1 to 20 $\mu$m.

12. The conductor paste of claim 1, wherein said vehicle is ethyl cellulose, nitrocellulose, an acrylic resin, terpineol, butyl carbitol or hexyl carbitol.

13. The conductor paste of claim 1, wherein the amount of said vehicle in the paste ranges from 5 to 70% by weight.

14. The conductor paste of claim 1, wherein the viscosity of the conductor paste ranges from 300 to 30,000 centipoise.

* * * * *

UNITED STATES PATENT AND TRADEMARK OFFICE
CERTIFICATE OF CORRECTION

PATENT NO. : 6,120,884

DATED : September 19, 2000

INVENTOR(S): Katsuhiko IGARASHI, et al.

It is certified that an error appears in the above-identified patent and that said Letters Patent is hereby corrected as shown below:

On the title page, the Foreign Application Priority Data has been omitted.
Item [30] should read as follows:

--[30]   Foreign Application Priority Data

Jul. 26, 1996   [JP]   Japan ................................. 8-197156--

Signed and Sealed this

Fifteenth Day of May, 2001

Attest:

NICHOLAS P. GODICI

Attesting Officer    Acting Director of the United States Patent and Trademark Office